(12) United States Patent
Lee et al.

(10) Patent No.: US 11,972,960 B2
(45) Date of Patent: Apr. 30, 2024

(54) IMAGING ELLIPSOMETRY (IE)-BASED INSPECTION METHOD AND METHOD OF FABRICATING SEMICONDUCTOR DEVICE BY USING IE-BASED INSPECTION METHOD

(71) Applicant: SAMSUNG ELECTRONICS CO., LTD., Suwon-si (KR)

(72) Inventors: Myungjun Lee, Seongnam-si (KR); Wookrae Kim, Suwon-si (KR); Jaehwang Jung, Hwaseong-si (KR); Myoungki Ahn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 618 days.

(21) Appl. No.: 16/833,903

(22) Filed: Mar. 30, 2020

(65) Prior Publication Data
US 2021/0028035 A1    Jan. 28, 2021

(30) Foreign Application Priority Data
Jul. 22, 2019   (KR) .................. 10-2019-0088525

(51) Int. Cl.
*H01L 21/67*   (2006.01)
*G01N 21/21*   (2006.01)
(Continued)

(52) U.S. Cl.
CPC ...... *H01L 21/67288* (2013.01); *G01N 21/211* (2013.01); *G01N 21/9501* (2013.01);
(Continued)

(58) Field of Classification Search
None
See application file for complete search history.

(56) References Cited

U.S. PATENT DOCUMENTS 6,090,332 A * 7/2000 Marder .................. G11C 13/04
264/435
6,798,511 B1 * 9/2004 Zhan .................... G01N 21/211
356/369
(Continued)

FOREIGN PATENT DOCUMENTS

CN      106517086 A * 3/2017  ........... B82B 3/0085
KR  10-2007-0098029 A    10/2007
(Continued)

OTHER PUBLICATIONS

Machine English Translation of KR-20140069352-A (Year: 2014).*
(Continued)

*Primary Examiner* — Mohammed Jebari
(74) *Attorney, Agent, or Firm* — Sughrue Mion, PLLC

(57) ABSTRACT

Provided is an imaging ellipsometry (IE)-based inspection method including selecting a mode from among a first mode of an IE-based inspection device having a first field of view (FOV) and a second mode of an IE-based inspection device having a second FOV, measuring an inspection target by the IE-based inspection device based on the selected mode, and determining whether the inspection target is normal based on a result of the measuring, wherein the measuring of the inspection target comprises simultaneously measuring patterns included in a plurality of cells provided in a region of the inspection target, the region corresponding to an FOV of the selected mode.

17 Claims, 14 Drawing Sheets

(51) Int. Cl.
  *G01N 21/95* (2006.01)
  *G06T 7/00* (2017.01)
  *H01L 21/66* (2006.01)
  *G01N 21/17* (2006.01)

(52) U.S. Cl.
  CPC .............. *G06T 7/001* (2013.01); *H01L 22/12* (2013.01); *G01N 2021/1765* (2013.01); *G01N 2201/12* (2013.01); *G01N 2201/13* (2013.01); *G06T 2207/30148* (2013.01)

(56) References Cited

U.S. PATENT DOCUMENTS

| | | | | |
|---|---|---|---|---|
| H2114 H | * | 2/2005 | Novak | ............................ 356/124 |
| 7,379,183 B2 | | 5/2008 | Mieher et al. | |
| 7,489,399 B1 | * | 2/2009 | Lee | ........................ G01N 21/211 |
| | | | | 356/369 |
| 9,841,688 B2 | | 12/2017 | Ko et al. | |
| 9,903,711 B2 | | 2/2018 | Levy et al. | |
| 10,101,676 B2 | | 10/2018 | Fu et al. | |
| 10,209,627 B2 | | 2/2019 | Lee et al. | |
| 2003/0021467 A1 | * | 1/2003 | Adel | ..................... G06V 40/171 |
| | | | | 382/145 |
| 2004/0011959 A1 | * | 1/2004 | Koike | ...................... H01J 37/28 |
| | | | | 250/310 |
| 2004/0169861 A1 | * | 9/2004 | Mieher | ............... G03F 7/70625 |
| | | | | 356/400 |
| 2006/0109457 A1 | * | 5/2006 | Miller | ................ G01N 21/9501 |
| | | | | 356/237.4 |
| 2006/0215175 A1 | * | 9/2006 | Yacoubian | ......... G01N 21/9505 |
| | | | | 356/502 |
| 2008/0088849 A1 | * | 4/2008 | De Lega | ............ G01B 9/02074 |
| | | | | 356/450 |
| 2009/0021723 A1 | * | 1/2009 | De Lega | ............ G01B 9/02027 |
| | | | | 356/73 |
| 2009/0103094 A1 | * | 4/2009 | Hilfiker | ................. G01N 21/211 |
| | | | | 356/369 |
| 2009/0262362 A1 | * | 10/2009 | de Groot | .......... G01N 21/95607 |
| | | | | 356/508 |
| 2013/0314710 A1 | | 11/2013 | Levy et al. | |
| 2016/0290934 A1 | * | 10/2016 | Wells | ................. H01L 21/67288 |
| 2017/0045826 A1 | | 2/2017 | Lee et al. | |
| 2018/0252514 A1 | | 9/2018 | Pandev et al. | |
| 2019/0004437 A1 | | 1/2019 | Bhattacharyya et al. | |
| 2019/0155172 A1 | * | 5/2019 | Shmarev | ............... G01N 21/956 |
| 2020/0232916 A1 | * | 7/2020 | Zhao | ...................... G01N 21/55 |

FOREIGN PATENT DOCUMENTS

| | | | | |
|---|---|---|---|---|
| KR | 20140069352 A | * | 6/2014 | .......... G01B 11/2441 |
| WO | WO-2005103790 A1 | * | 11/2005 | ............... G01B 9/04 |

OTHER PUBLICATIONS

Jan Mulkens et al., "Holistic approach for overlay and edge placement error to meet the 5-nm technology node requirements", Proc. of SPIE, vol. 10585, SPIE, Mar. 13, 2018, 15 pages.

\* cited by examiner

IMAGING ELLIPSOMETRY (IE)-BASED INSPECTION METHOD AND METHOD OF FABRICATING SEMICONDUCTOR DEVICE BY USING IE-BASED INSPECTION METHOD

CROSS-REFERENCE TO RELATED APPLICATION

This application claims priority from Korean Patent Application No. 10-2019-0088525, filed on Jul. 22, 2019, in the Korean Intellectual Property Office, the disclosure of which is incorporated herein in its entirety by reference.

BACKGROUND

Example embodiments of the present disclosure relate to an inspection device and an inspection method, and more particularly, to an inspection device and an inspection method, which are based on imaging ellipsometry.

Ellipsometry is an optical technique for studying dielectric properties of wafers. Ellipsometry allows the calculation of information about specimens by analyzing polarization changes of reflected light that is reflected by the specimens, for example, wafer surfaces. For example, when light is reflected by a specimen, a polarization state of reflected light varies depending upon optical properties of a specimen material, thicknesses of specimen layers, and the like. Ellipsometry allows the calculation of a complex refractive index or a dielectric function tensor, which is a basic physical quantity of a material, by measuring polarization changes set forth above and also allows the derivation of information about specimens, such as shapes of materials, crystal states, chemical structures, electrical conductivity, and the like. In addition, imaging ellipsometry (IE) and spectroscopic imaging ellipsometry (SIE) are types of ellipsometry using a broadband light source.

SUMMARY

One or more example embodiments provide an imaging ellipsometry (IE)-based inspection method, which allows a more precise measurement of measurement keys on a wafer in a large-area and high-speed manner, and a method of fabricating a semiconductor device by using the IE-based inspection method.

According to an aspect of an example embodiment, there is provided an imaging ellipsometry (IE)-based inspection method including selecting a mode from among a first mode of an IE-based inspection device having a first field of view (FOV) and a second mode of an IE-based inspection device having a second FOV, and measuring an inspection target by the IE-based inspection device based on the selected mode, wherein the measuring of the inspection target comprises simultaneously measuring patterns included in a plurality of cells provided in a region of the inspection target, the region corresponding to the FOV of the selected mode.

According to another aspect of an example embodiment, there is provided an imaging ellipsometry (IE)-based inspection method including obtaining a two-dimensional (2D) image for each wavelength of patterns included in a plurality of cells of an inspection target by an IE-based inspection device, and extracting intensity data of each wavelength from the 2D image of each wavelength, wherein the obtaining of the 2D image for each wavelength comprises simultaneously measuring the patterns included in the plurality of cells.

According to yet another aspect of an example embodiment, there is provided a method of fabricating a semiconductor device including selecting a mode from among a first mode of an imaging ellipsometry (IE)-based inspection device having a first field of view (FOV) and a second mode of an IE-based inspection device having a second FOV, measuring a wafer by the IE-based inspection device in the selected mode, determining whether the wafer is normal based on a result of the measuring, and based on determining that the wafer is normal, performing a semiconductor process on the wafer, wherein the measuring of the wafer comprises simultaneously measuring patterns included in a plurality of cells provided in a region of the wafer, the region corresponding to the FOV of the selected mode

BRIEF DESCRIPTION OF THE DRAWINGS

The above and/or other aspects, features, and advantages will be more clearly understood from the following detailed description of example embodiments taken in conjunction with the accompanying drawings, in which.

DETAILED DESCRIPTION OF THE EMBODIMENTS

Figure 1:
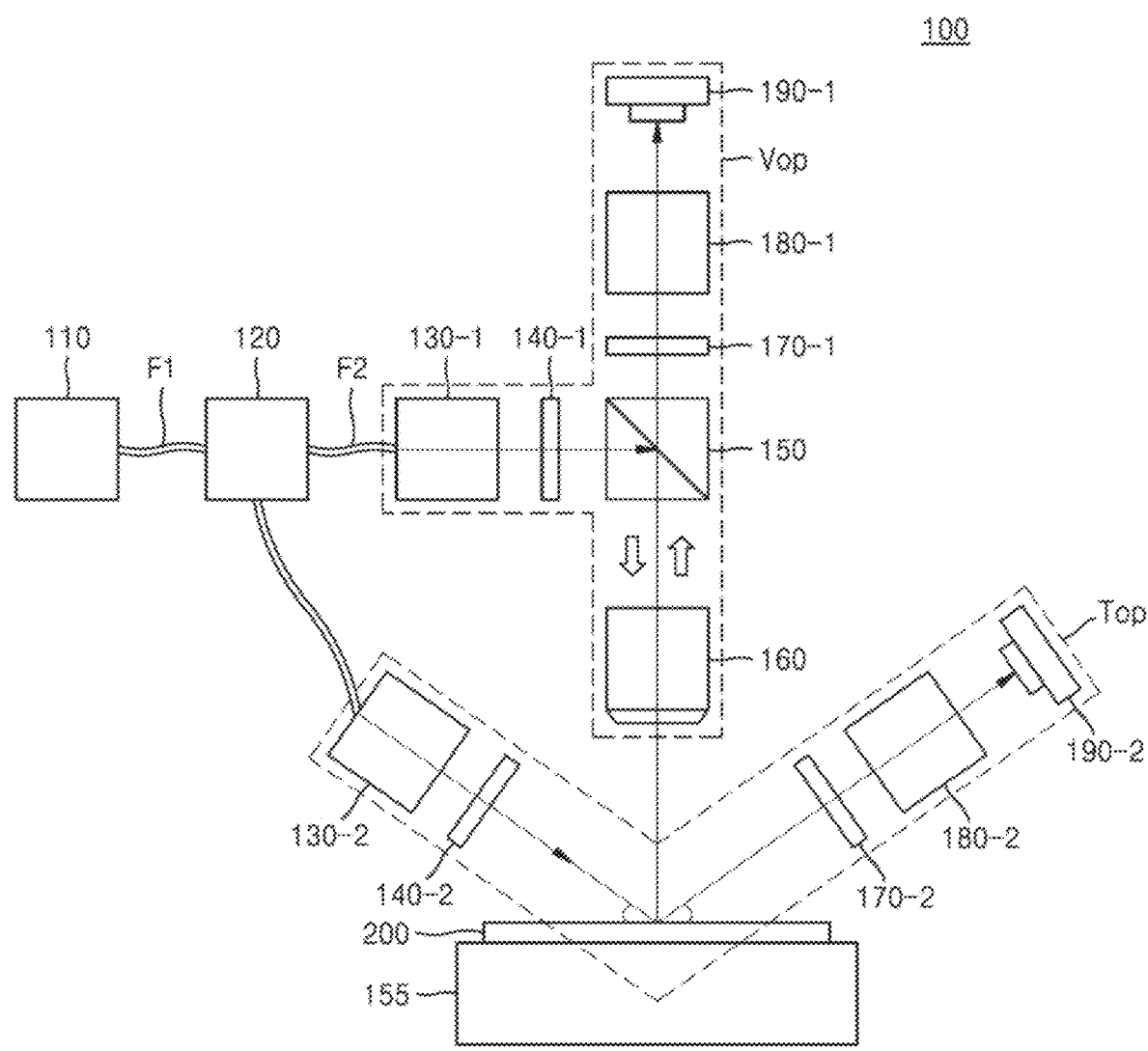
FIG. 1 is a structure diagram schematically illustrating an imaging ellipsometry (IE)-based inspection device according to an example embodiment.

Hereinafter, example embodiments will be described in detail with reference to the accompanying drawings. Like components will be denoted by like reference numerals throughout the specification, and repeated descriptions thereof will be omitted.

As used herein, expressions such as "in front of," "ahead of," or "before" and "at a rear side of," "at a back side of," or "behind" may denote relative positions with respect to corresponding components based on a traveling direction of light. For example, when light passes through the lens and then passes through a certain component, the lens may be arranged in front of the certain component. When light passes through the certain component first and then passes through the lens, the lens may be arranged at a rear side of the certain component.

FIG. 1 is a structure diagram schematically illustrating an imaging ellipsometry (IE)-based inspection device according to an example embodiment.

Referring to FIG. 1, an IE-based inspection device 100 of the example embodiment may be an inspection device that is based on imaging ellipsometry (IE). Here, IE may include spectroscopic imaging ellipsometry (SIE). For reference, ellipsometry is a method of measuring an optical fine-structure of a single-layer or multilayer thin film on a specimen by analyzing a polarization state changed when an incident light is reflected by the specimen, and ellipsometry may not require a particular measurement condition such as vacuum because ellipsometry uses the reflection of light. In addition, spectroscopic ellipsometry, which includes an added spectroscopic function, measures and analyzes an inspection target based on a large amount of information measured at several wavelengths, and thus may improve the reliability of analysis. A method of measuring and analyzing an inspection target by obtaining a two-dimensional (2D) image by a detector such as a charge-coupled device (CCD) camera or the like, based on ellipsometry or spectroscopic ellipsometry set forth above, is referred to as an imaging ellipsometry (IE) or spectroscopic imaging ellipsometry (SIE).

The inspection device 100 of the example embodiment may include a vertical optical system Vop, a tilted optical system Top, and a stage 155. In FIG. 1, the vertical optical system Vop and the tilted optical system Top are marked by dashed lines, and a light source 110 and a monochromator 120 may also be included in the vertical optical system Vop and the tilted optical system Top.

The vertical optical system Vop may include the light source 110, the monochromator 120, a first collimator 130-1, a first polarizer 140-1, a beam splitter 150, an objective lens 160, a first analyzer 170-1, a first imaging lens unit 180-1, and a first detector 190-1.

In optical inspection devices, optical systems include an illumination optical system and an imaging optical system. In general, the illumination optical system may be an optical system on a path ranging from the light source 110 to an inspection target 200 and the imaging optical system may be an optical system on a path ranging from the inspection target 200 to a detector. For example, in the vertical optical system Vop, an illumination optical system may include the first collimator 130-1, the first polarizer 140-1, and the beam splitter 150, and an imaging optical system may include the objective lens 160, the first analyzer 170-1, and the first imaging lens unit 180-1. In addition, in the tilted optical system Top, an illumination optical system may include a second collimator 130-2 and a second polarizer 140-2, and an imaging optical system may include a second analyzer 170-2 and a second imaging lens unit 180-2.

The light source 110 may be a broadband light source or a multi-wavelength light source, which generates and outputs broadband light. The broadband light of the light source 110 may be polychromatic light including light having a plurality of wavelength bands. For example, in the inspection device 100 of the example embodiment, the light source 110 may generate and output light having a wavelength range of 150 nm to 2100 nm. However, the wavelength range of the light generated by the light source 110 is not limited to the range set forth above. For example, the light source 110 may be a halogen lamp light source or a light-emitting diode (LED) light source, which generates continuous-spectrum light. However, the type of light source 110 is not limited thereto. In the inspection device 100 of the example embodiment, various spectra may be configured by implementing the light source 110 as a broadband light source.

The monochromator 120 may convert broadband light of the light source 110 into monochromatic light and output the monochromatic light. Here, the monochromatic light may be light having an extremely small wavelength width. For example, the monochromatic light may be light having a wavelength width of about a few nanometers. The monochromator 120 may output a plurality of rays of monochromatic light while performing sweeping with a wavelength width set in a certain wavelength range. The monochromator 120 may include a grating or a prism, which may divide incident light by wavelength.

The first collimator 130-1 may convert the monochromatic light, received from the monochromator 120, into parallel light and output the parallel light. Light may be transferred from the light source 110 to the monochromator 120 via a first optical fiber F1, and light may be transferred from the monochromator 120 to the first collimator 130-1 via a second optical fiber F2. However, the transfer of light is not limited to the transfer thereof via an optical fiber.

The first polarizer 140-1 may perform polarization on light received from the first collimator 130-1 and output the polarized light. Polarization may include, for example, at least one selected from the group consisting of linear polarization, circular polarization, and elliptical polarization. Here, linear polarization may refer to converting incident light into linearly polarized light by passing only a p-polarization component (or horizontal component) or an s-polarization component (or vertical component) of the incident light. In addition, circular polarization or elliptical polarization may refer to converting linearly polarized light into circularly or elliptically polarized light by applying a phase shift to the linearly polarized light or, converting circularly or elliptically polarized light into linearly polarized light. Thus, a polarizer performing circular polarization or elliptical polarization may also be a phase retarder.

The beam splitter 150 may output light received from the first polarizer 140-1 to the inspection target 200 and may output reflected light, which is light reflected by the inspection target 200, toward the first detector 190-1. For example, the beam splitter 150 may output light received from the first polarizer 140-1 to the inspection target 200 by transmitting or reflecting the light from the first polarizer 140-1 and may output reflected light from the inspection target 200 toward the first detector 190-1 by reflecting or transmitting the reflected light.

The objective lens 160 may concentrate light received from the beam splitter 150 and output the concentrated light toward the inspection target 200. In addition, the objective lens 160 may output reflected light, which is light reflected by the inspection target 200, to the beam splitter 150.

The first analyzer 170-1 may be arranged at a rear side of the beam splitter 150 between the beam splitter 150 and the first imaging lens unit 180-1, and may selectively pass reflected light, which is reflected by the inspection target 200 and thus has a changed polarization direction. For example, the first analyzer 170-1 may pass only a particular polarization component of incident light and may block the remaining components of the incident light. According to example embodiments, the first analyzer 170-1 may be arranged at a rear side of the first imaging lens unit 180-1 between the first detector 190-1 and the imaging lens unit 180-1.

The first imaging lens unit 180-1 may include at least one lens for imaging. For example, the first imaging lens unit 180-1 may include an imaging tube lens. The first imaging lens unit 180-1 may output light reflected by the inspection target 200 to the first detector 190-1, and thus image the inspection target 200 on the first detector 190-1. At least a portion of the inspection target 200, which corresponds to a field of view (FOV), may be imaged on the first detector 190-1 via the first imaging lens unit 180-1.

The first detector 190-1 may generate a 2D image of the inspection target 200. For example, the first detector 190-1 may receive, via the first imaging lens unit 180-1, light reflected by the inspection target 200, and thus image the inspection target 200 on an imaging plane. As described above, the 2D image of the inspection target 200 may be a 2D image corresponding to the FOV of the first detector 190-1. The first detector 190-1 may be, for example, a CCD camera. However, the first detector 190-1 is not limited to a CCD camera.

The first detector 190-1 may generate a plurality of 2D images of the inspection target 200 corresponding to a plurality of wavelength bands. For example, in the inspection device 100 of the example embodiment, the light source 110 may generate and output broadband light, and the monochromator 120 may divide the broadband light into rays of light respectively having a plurality of wavelength bands, and may output the rays of light sequentially to the inspection target 200. Thus, the first detector 190-1 may respectively generate a plurality of 2D images of the inspection target 200 corresponding to the wavelength bands.

In the inspection device 100 of the present example embodiment, the first detector 190-1 may be a detector having high resolution. For example, the first detector 190-1 may have a pixel size of 500 nm or less and have an FOV of 400*400 µm$^2$ or more. However, each of the pixel size and the FOV of the first detector 190-1 is not limited to the value set forth above. The first detector 190-1 may have extremely high resolution due to a fine pixel size thereof. For example, the first detector 190-1 may have a resolution of 500 nm or less.

Figure 2:
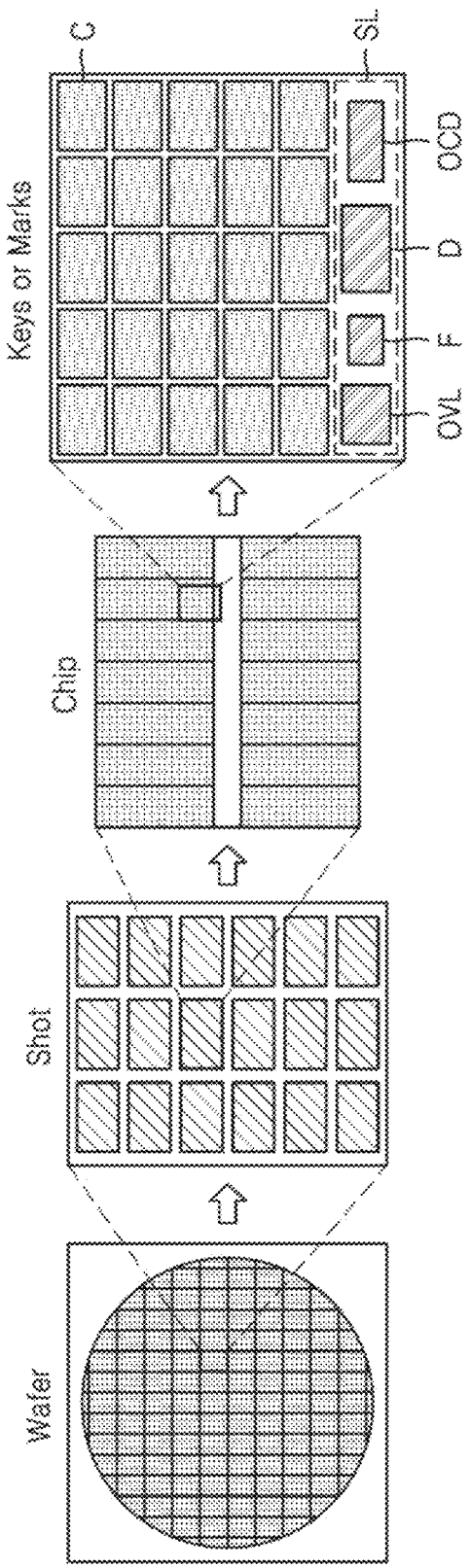
FIG. 2 is a conceptual diagram illustrating an arrangement of measurement keys on a wafer, the measurement keys being measured by using the IE-based inspection device of FIG. 1.

According to the inspection device 100 of the present example embodiment, the first detector 190-1 may be implemented to have a high resolution based on the vertical optical system Vop, and thus allow measurement keys or measurement marks as illustrated in FIG. 2 in the inspection target 200 to be finer-sized and more highly densified, to improve simultaneous measurement and/or measurement throughput for the measurement keys. In addition, because the first detector 190-1 may have an extremely small spot size or almost no spot size, signal distortion caused by mismatching between the spot size and the size of a measurement key, and a reduction in measurement consistency due thereto may be improved. Manufacturing the measurement keys finer-sized and more highly densified will be described in more detail with reference to FIGS. 5A to 5D.

The tilted optical system Top may include the light source 110, the monochromator 120, the second collimator 130-2, the second polarizer 140-2, the second analyzer 170-2, the second imaging lens unit 180-2, and a second detector 190-2.

As described above, the vertical optical system Vop and the tilted optical system Top may share the light source 110 and the monochromator 120, and the operations of the light source 110 and the monochromator 120 may be substantially the same between the vertical optical system Vop and the tilted optical system Top.

The second collimator 130-2, the second polarizer 140-2, and the second analyzer 170-2 may be respectively different in arrangement positions from the first collimator 130-1, the first polarizer 140-1, and the first analyzer 170-1, and may respectively perform substantially the same operations as the first collimator 130-1, the first polarizer 140-1, and the first analyzer 170-1. For example, as shown in FIG. 1, the second collimator 130-2 and the second polarizer 140-2 may be arranged on a light propagation path, via which monochromatic light is output from the monochromator 120 to the inspection target 200 at a tilted angle. The second analyzer 170-2 may be arranged on a light propagation path, via which light reflected by the inspection target 200 is emitted at a tilted angle toward the second detector 190-2. Here, the tilted angle may be defined with respect to a top surface of the inspection target 200 or defined with respect to a direction normal to the top surface of the inspection target 200. The second collimator 130-2 may convert monochromatic light received from the monochromator 120 into parallel light, and output the parallel light. The second polarizer 140-2 may perform polarization on light received from the second collimator 130-2 and output the polarized light, and the second analyzer 170-2 may selectively pass reflected light, which is reflected by the inspection target 200, and thus has a changed polarization direction.

The second imaging lens unit 180-2 may include at least one lens for imaging. For example, the second imaging lens unit 180-2 may include an imaging tube lens. The second imaging lens unit 180-2 may cause the inspection target 200 to be imaged on the second detector 190-2. Rather than the entire inspection target 200, only a portion of the inspection target 200, which corresponds to an FOV, may be imaged on the second detector 190-2 via the second imaging lens unit 180-2.

The second detector 190-2 may generate a 2D image of the inspection target 200. For example, the second detector 190-2 may receive, via the second imaging lens unit 180-2, light reflected by the inspection target 200, and thus image the inspection target 200 on an imaging plane. The second detector 190-2, like the first detector 190-1, may generate a plurality of 2D images of the inspection target 200 in correspondence with a plurality of wavelength bands. The second detector 190-2 may also be, for example, a CCD camera. However, the second detector 190-2 is not limited to a CCD camera.

In the inspection device 100 of the example embodiment, the second detector 190-2 may be able to detect an image at a relatively high-resolution and detect a large-area. For example, the second detector 190-2 may have a pixel size of 10 µm or less and have an FOV of up to 9*9 mm$^2$. Thus, the second detector 190-2 may measure a portion of the inspection target 200, which corresponds to a large FOV, with high resolution by performing imaging once. For example, the second detector 190-2 may obtain a 2D image of the inspection target 200, with a resolution of about 5 µm to about 10 µm and an FOV of 8*5 mm$^2$. Therefore, the second detector 190-2 may measure the inspection target 200 in units of planes at high speed, based on a large FOV.

For reference, when the first detector 190-1 is approximately compared with the second detector 190-2 in terms of resolution and FOV, the first detector 190-1 may have 10 or more times as high resolution as the second detector 190-2. In addition, the second detector 190-2 may have 100 or more times as large FOV as the first detector 190-1. However, the relative magnitude of each of resolution and FOV between the first detector 190-1 and the second detector 190-2 is not limited to the value set forth above.

In the inspection device 100 of the example embodiment, because the second detector 190-2 is implemented to have a large-area FOV based on a tilted optical system, measurement keys included in a portion of the inspection target 200, which corresponds to the FOV, may be measured at once. Therefore, a rate of measuring the measurement keys of the inspection target 200 may be significantly improved. The measurement keys formed on the inspection target 200, and the large-area/high-speed measurement by the second detector 190-2 will be described in more detail with reference to FIG. 2.

The inspection target 200 may be arranged on the stage 155. The stage 155 may move the inspection target 200 by linear movements in x, y, and z directions. Thus, the stage 155 may be an x-y-z stage. According to example embodiments, the stage 155 may move the inspection target 200 by linear and/or rotational movements.

Here, the inspection target 200 may include various devices targeted to be inspected, such as wafers, semiconductor packages, semiconductor chips, display panels, and the like. For example, in the inspection device 100 of the example embodiment, the inspection target 200 may be a wafer including a plurality of semiconductor chips. In addition, a plurality of measurement keys for lithography process control may be formed on the wafer that is the inspection target 200. For example, the plurality of measurement keys may include an overlay key, a focus key, a dose key, a critical dimension (CD) key, or the like.

Each of the vertical optical system Vop and the tilted optical system Top may further include optical components in addition to the components described above. For example, the vertical optical system Vop may further include a shutter, a neutral density (ND) filter, at least one reflection mirror, a focus lens, or the like in an illumination optical system portion. In addition, the tilted optical system Top may include a shutter and an ND filter in an illumination optical system portion and include at least one folding mirror in the imaging optical system portion.

The inspection device 100 of the example embodiment may include the vertical optical system Vop in a high-resolution mode and the tilted optical system Top in a large-area mode. Therefore, based on the vertical optical system Vop, the inspection device 100 of the example embodiment may allow the measurement keys in the inspection target 200 to be finer-sized and more highly densified, and may improve simultaneous measurement and/or measurement throughput for the measurement keys.

The inspection device 100 of the example embodiment may measure the inspection target 200 in units of planes at a relatively high speed by measuring the inspection target 200 with high resolution and a large-area FOV, based on the tilted optical system Top. In addition, overlays between measurement keys, for example, overlay keys, in scribe lanes and overlays between patterns in cells are measured together, whereby in-shot overlay locality according to process variation may be obtained and data with higher accuracy may be obtained by removing or reducing noise due to an average effect. The measurement of on-cell overlays and effects thereof will be described in more detail with reference to FIGS. 6A and 6B.

The inspection device 100 of the example embodiment may reduce or minimize a spot size based on the relatively high resolution, and thus, may improve signal distortion caused by mismatching between the spot size and the size of the measurement key and a reduction in measurement consistency caused due to the signal distortion.

The inspection device 100 of the example embodiment may measure and inspect the measurement keys, which are formed on the inspection target 200 with precision and high resolution, and in a large-area, and at a high speed by the vertical optical system Vop in a high-resolution mode and the tilted optical system Top in a large-area mode, thereby detecting errors and/or measuring CD etc., in a semiconductor process, for example, a lithography process. In addition, the inspection device 100 of the example embodiment may provide feedback data regarding the measurement keys, the data being obtained through measurements, thereby allowing the data to be used as reference data in a lithograph process or to be used for calibration of the reference data. Further, the lithograph process may be more efficiently controlled by using the reference data obtained as such.

FIG. 2 is a conceptual diagram illustrating an arrangement of measurement keys on a wafer, the measurement keys being measured by using the IE-based inspection device of FIG. 1.

Referring to FIG. 2, a wafer that is the inspection target 200 is shown on the far left, and a plurality of shots divided by straight lines are shown in the wafer. A shot may be a process of transferring patterns on a mask onto a wafer by performing exposure in a lithograph process or be a region on the wafer corresponding to the patterns.

As illustrated in FIG. 2, the enlarged shot illustrates that one shot may include a plurality of chips. For example, one shot in FIG. 2 may include 18 chips. However, the number of chips included in a shot is not limited thereto. For example, depending on the types of chips, a shot may include one chip or various numbers of chips.

As illustrated in the enlarged chip in FIG. 2, one chip, for example, a memory chip such as DRAM, may have a structure in which a plurality of banks are arranged on both sides of a scribe lane that is arranged in a central region. A bank may be a collection of a plurality of cells, and a scribe lane may be arranged between banks. A scribe lane may generally be a region for sawing, but is not limited thereto. A scribe lane may be a region except for a bank region in which cells are arranged.

Figure 3A:
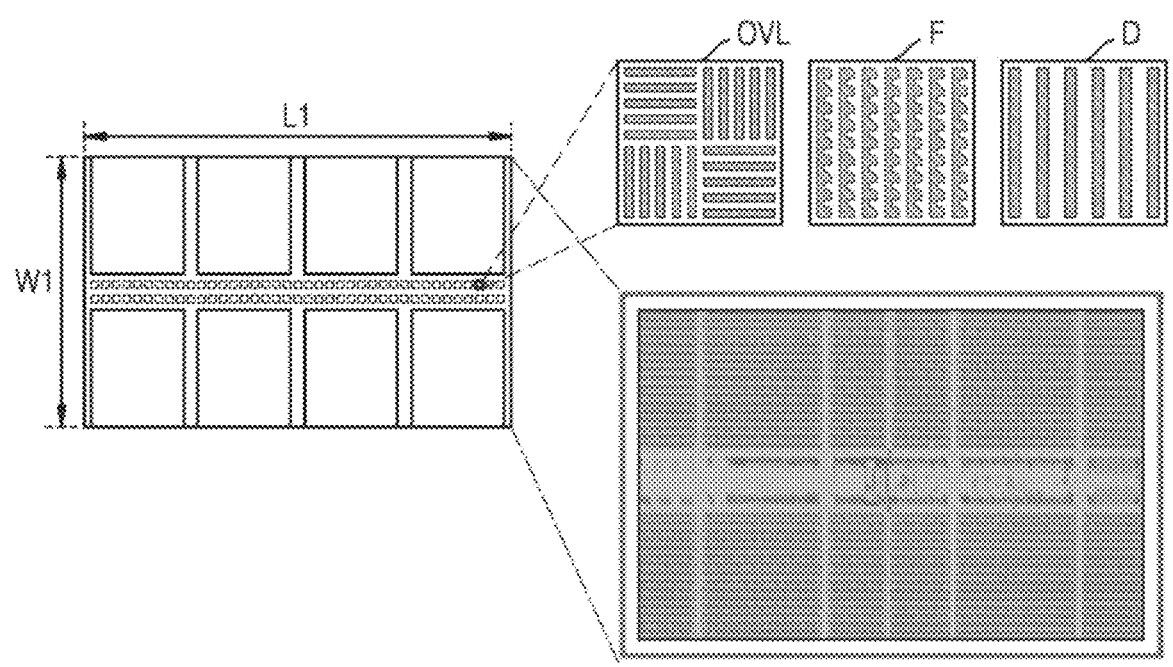
FIGS. 3A and 3B are conceptual diagrams illustrating a method of measuring measurement keys on a wafer by using the IE-based inspection device of FIG. 1.

A portion of a chip is enlarged and shown on the far right, and cells C in a bank and a portion of a scribe lane SL are shown together. As shown in FIG. 2, measurement keys may be arranged in the scribe lane SL. The measurement keys may include, for example, an overlay key OVL, a focus key F, a dose key D, a CD key OCD, or the like. Although the measurement keys are illustrated as quadrangles, each of the measurement keys may include complicated-structured patterns therein, for example, as shown in FIG. 3A. In addition, although the measurement keys are arranged in a line in the scribe lane SL, an arrangement of the measurement keys is not limited thereto. For example, the measurement keys may be arranged in various arrangements at various positions in the scribe lane SL. In addition, the measurement keys may be arranged in a cell as well as in the scribe lane SL.

Figure 3B:
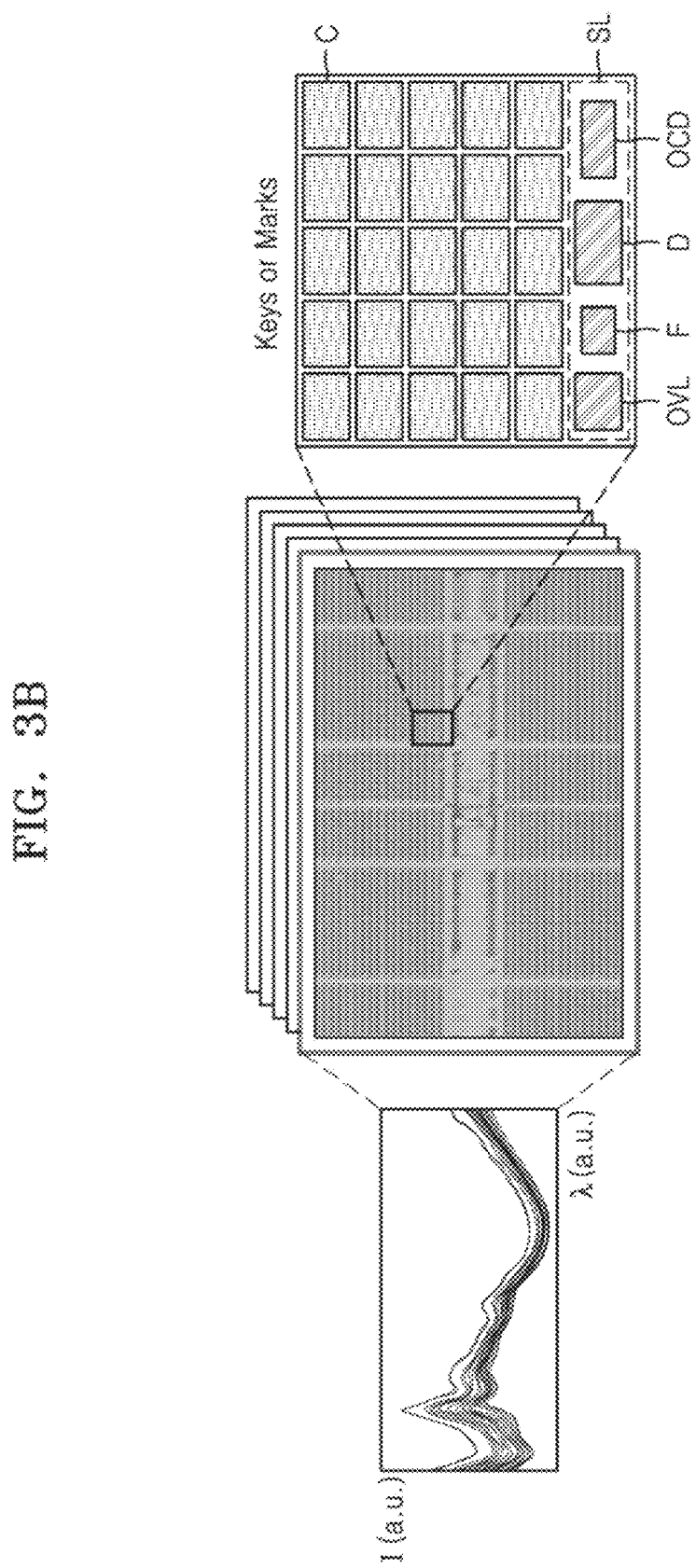

FIGS. 3A and 3B are conceptual diagrams illustrating a method of measuring measurement keys on a wafer by using the IE-based inspection device of FIG. 1. Descriptions will be made with reference to FIGS. 3A and 3B together with FIG. 1, and repeated descriptions given with reference to FIGS. 1 and 2 will be briefly made or omitted.

Referring to FIG. 3A, four banks may be arranged on each side of a scribe lane arranged in a central region in one chip. However, the number of banks in the chip is not limited to 8 as illustrated in FIG. 3A. A plurality of measurement keys may be arranged in the scribe lane. In addition, the measurement keys may also be arranged between the banks.

The measurement keys, for example, the overlay key OVL, the focus key F, and the dose key D, are enlarged and shown in FIG. 3A. Each of the measurement keys may be generally formed at a size of about 30 μm. Existing inspection devices may perform measurement on each of the measurement keys in a point measurement manner. In the case of such a point measurement manner, a spot of an inspection device may need to be completely included in a measurement key to achieve high measurement consistency. When the spot of the inspection device partially deviates from the measurement key, because signal distortion occurs due to inclusion of a signal of an edge portion of the measurement key, the measurement consistency may be reduced.

Recently, as processes of manufacturing finer sized semiconductor structures continue, higher densification and higher-speed measurement for measurement keys are required to cope with the processes for finer sizes, and thus, measurement keys are also reduced in size. Along with the size-reduction of measurement keys, a spot size of an optical system for measuring the measurement keys may need to be reduced. However, there may be issues such as a reduction in measurement throughput due thereto, a reduction in measurement consistency due to signal distortion caused by mismatching between the spot size and the size of a measurement key, and the like.

The inspection device 100 of the example embodiment may precisely measure the inspection target 200 at high speed with high resolution and a large-area FOV by using the tilted optical system Top. As described above, in the inspection device 100 of the example embodiment, the second detector 190-2 of the tilted optical system Top may have a resolution of 10 μm or less and an FOV of up to about 9*9 mm$^2$. When a chip has a first length L1 of 8 mm and a first width W1 of 5 mm, the second detector 190-2 may obtain a 2D image of the entire chip by performing imaging once as shown in FIG. 3A, and thus, all the measurement keys arranged in the chip may be measured at once.

As a specific example, when a measurement key has a size of 30 μm, 200 or more measurement keys may be arranged in a direction of length corresponding to 8 mm, and thus, the inspection device 100 of the example embodiment may simultaneously measure the 200 or more measurement keys by the second detector 190-2. In addition, hundreds of measurement keys may be generally formed within one shot. For example, each of the overlay key OVL, the focus key F, and the dose key D may be formed in a number of 100 or more within one shot. According to point measurement-type inspection devices of the related art, an excessive amount of time is required to measure all of the measurement keys, and thus, only measurement keys in a limited region may be measured by sampling. However, errors in sampling, and distortion of measurement information due to the errors may be unavoidable. On the other hand, according to the inspection device 100 of the example embodiment, considering the FOV of the second detector 190-2, and based on the size of a shot being about 12*FOV, all of the measurement keys included in the shot may be measured by performing imaging 12 times, and thus, an issue of measurement distortion caused by measuring only the measurement keys in the limited region through sampling may be improved.

Referring to FIG. 3B, in the inspection device 100 of the example embodiment, both the vertical optical system Vop and the tilted optical system Top may perform inspection based on SIE. For example, images for respective wavelengths regarding the inspection target 200 may be obtained, and information about corresponding measurement keys may be obtained by mapping the respective images to feature values according to wavelengths.

As a specific example, as shown in FIG. 3B, a plurality of images for respective wavelengths may be obtained for one chip, and the intensity I for each wavelength may be extracted for a measurement key, for example, the overlay key OVL, thereby obtaining a graph as shown in FIG. 3B. Next, consistency of an overlay key of a corresponding chip may be determined by comparing the graph obtained with a reference graph stored in a database (DB). When there is no reference graph in the DB, the reference graph may be derived through deep learning by using, as source data, graphs obtained from a plurality of chips, and the consistency may also be determined by comparing the graph obtained with the derived reference graph.

Although extraction of the intensity I for each wavelength as measured data has been exemplified above, the measured data is not limited to the intensity I for each wavelength. For example, Psi (ψ) for each wavelength and/or wavelength-Delta (δ) for each wavelength may be extracted as measured data. Here, Psi (ψ) may be a ratio of P-wave and S-wave, and Delta (δ) may be phase difference between P-wave and S-wave.

Figure 4A:
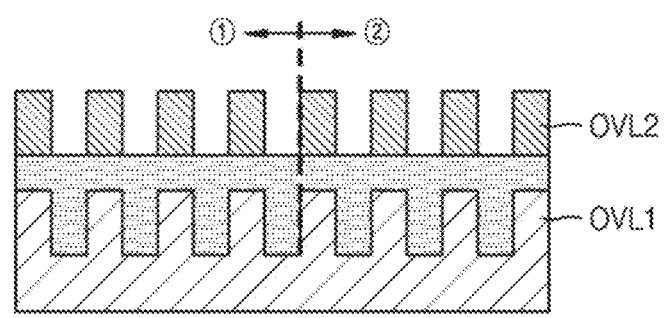
FIGS. 4A and 4B are conceptual diagrams illustrating principles of measuring, by using the IE-based inspection device of FIG. 1, an overlay key and a focus key, respectively, the overlay key and the focus key being formed on a wafer.
Figure 4A:
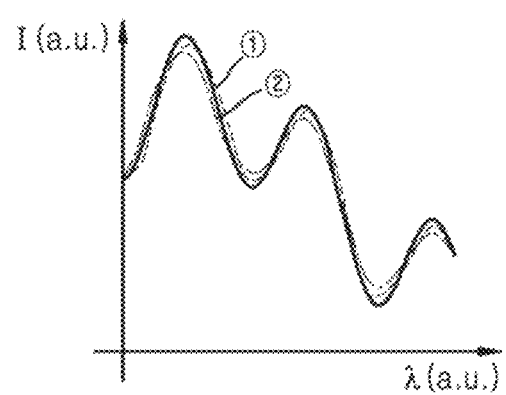
Figure 4B:
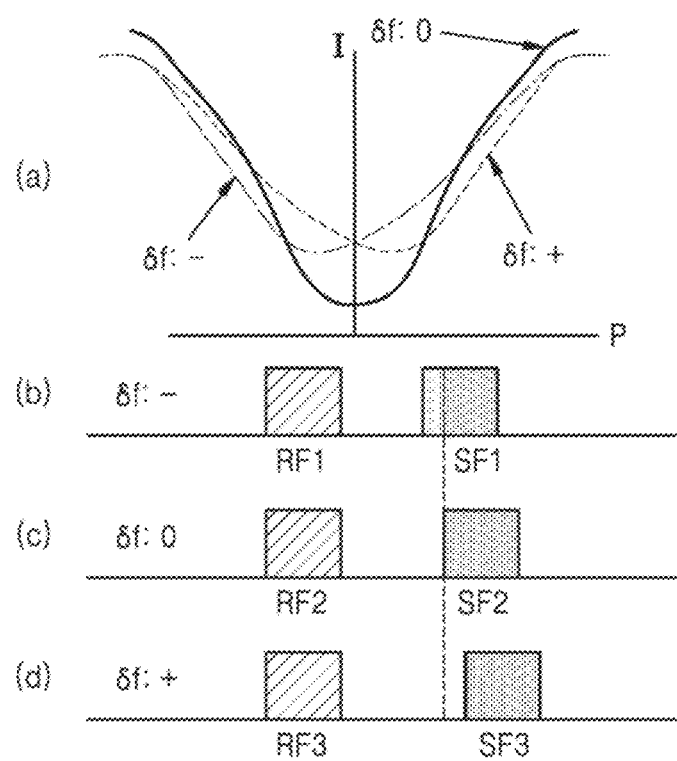

FIGS. 4A and 4B are conceptual diagrams illustrating principles of measuring, by using the IE-based inspection device of FIG. 1, an overlay key and a focus key formed on a wafer, respectively. Descriptions will be made with reference to FIGS. 4A and 4B together with FIGS. 1 and 2, and repeated descriptions given with reference to FIGS. 1 to 3B will be briefly made or omitted.

Referring to FIG. 4A, the overlay key OVL may be a key for alignment between a lower layer and an upper layer. For example, an alignment state between the upper layer and the lower layer may be inspected by measuring a position error between a first overlay key OVL1 of the lower layer and a second overlay key OVL2 of the upper layer.

The inspection device 100 of the example embodiment may inspect the alignment state between the upper layer and the lower layer by extracting intensity for each wavelength regarding the first overlay key OVL1 and the second overlay key OVL2, based on SIE. For example, in the case where intensities for respective wavelengths have a shape shown as the solid line while the first overlay key OVL1 is aligned with the second overlay key OVL2, when the second overlay key OVL2 is moved left and thus out of alignment, the intensities for respective wavelengths may be extracted as a graph shown in the dashed line ①, and when the second overlay key OVL2 is moved right and thus out of alignment, the intensities for respective wavelengths may be extracted as a graph shown in the dashed single-dotted line ②. Therefore, according to the inspection device 100 of the example embodiment, a 2D image for each wavelength may be obtained, and a graph depicting intensity for each wavelength may be extracted for a corresponding overlay key and compared with a reference graph, for example, the graph marked by the solid line in FIG. 4A, thereby inspecting the alignment state between the upper layer and the lower layer.

Referring to FIG. 4B, the focus key F may be a key for checking a focus state in a lithograph process. In general, a pattern corresponding to the focus key F may be formed on a mask, and the focus key F may be formed on a substrate by transferring the corresponding pattern through a lithograph process.

FIG. 4B illustrates focus keys RF2 and SF2 when a defocus is 0, focus keys RF1 and SF1 when the defocus is negative (−), and focus keys RF3 and SF3 when the defocus is positive (+). Depending upon defocus states, positions of right focus keys SF1, SF2, and SF3 may vary because portions of the mask, which correspond to the right focus keys SF1, SF2, and SF3, are formed in phase-shift structures.

The inspection device 100 of the example embodiment may inspect a focus state by extracting intensity for each wavelength regarding focus keys, based on SIE. For example, the intensity for each wavelength may be extracted as a graph shown as the solid line in (a) when the defocus is 0 as in (c), the intensity for each wavelength may be extracted as a graph shown as the dashed single-dotted line in (a) when the defocus is negative (−), and the intensity for each wavelength may be extracted as a graph shown as the dashed line in (a) when the defocus is (+). Therefore, according to the inspection device 100 of the example embodiment, a 2D image for each wavelength may be obtained, and a graph depicting the intensity for each wavelength may be extracted for a corresponding focus key and compared with a reference graph. For example, the graph marked by the solid line in (a) of FIG. 4B, thereby inspecting the focus state.

The principle of measuring the dose key D may be similar to that in the case of the focus key F. For example, in a lithograph process, the shape of a dose key may vary depending upon a dose, and thus, the intensity for each wavelength may vary. Therefore, the inspection device 100 of the example embodiment may obtain a 2D image for each wavelength, may extract a graph depicting intensity for each wavelength regarding a corresponding dose key, and may compare the graph with a reference graph, thereby inspecting a dose state.

FIGS. 5A to 5D are plan views illustrating shapes of measurement keys designed to have high densities in order to be used with the IE-based inspection device of FIG. 1 according to an example embodiment. Descriptions will be made with reference to FIGS. 5A to 5D together with FIG. 1, and repeated descriptions given with reference to FIGS. 1 to 4B will be briefly made or omitted.

Figure 5A:
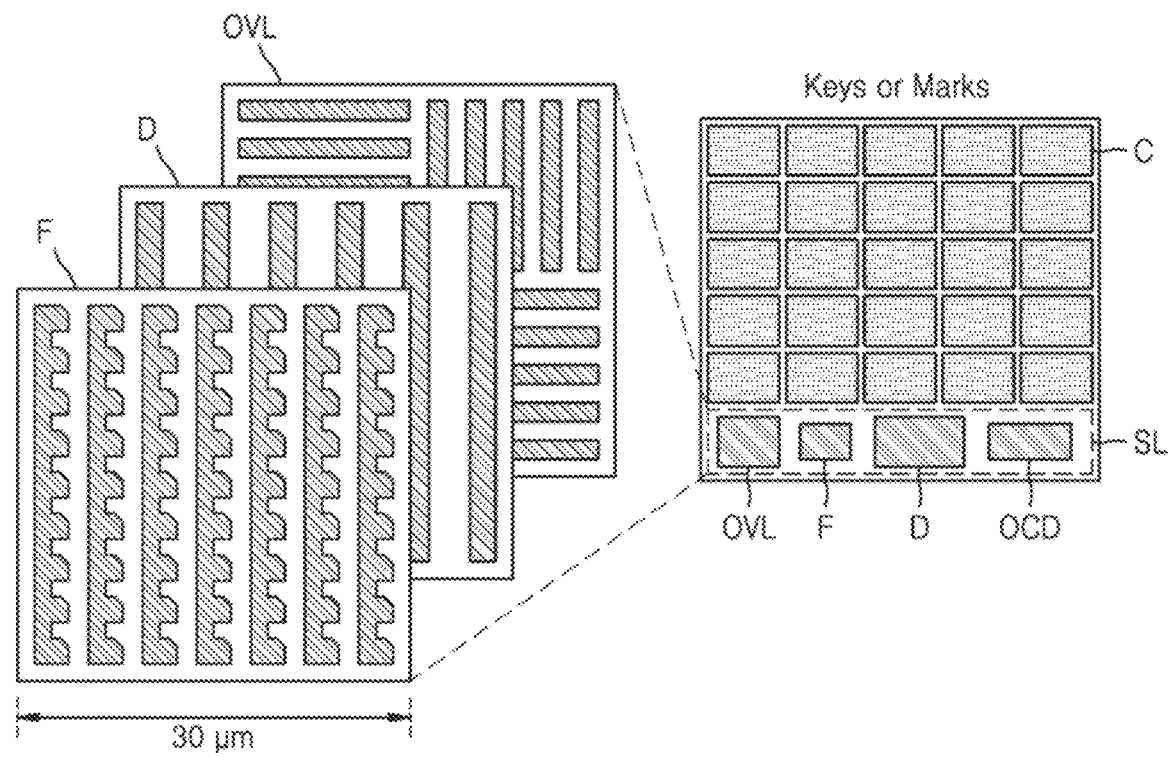
FIGS. 5A to 5D are plan views illustrating shapes of measurement keys designed to have high densities in order to be used with the IE-based inspection device of FIG. 1 according to an example embodiment.

Referring to FIG. 5A, the focus key F, the dose key D, and the overlay key OVL, which are formed on the scribe lane SL, are enlarged and shown in FIG. 5A. Each of the focus key F, the dose key D, and the overlay key OVL may be formed to have a size greater than or equal to 30 μm. Here, the size of 30 μm may be a length of each side of a square. However, the shape of each of the focus key F, the dose key D, and the overlay key OVL is not limited to a square, and may have various shapes.

When formed to have a size greater than or equal to 30 μm, the focus key F, the dose key D, the overlay key OVL, and the like may not be suitable for processes for finer sizes and occupy a lot of spaces. Thus, it may be difficult to form each key set forth above at an appropriate position in a chip, or each key set forth above may limit space utilization of cells. However, in inspection devices of the related art, because a spot size is limited, it is difficult to reduce the sizes of the measurement keys to 30 μm or less.

Figure 5B:
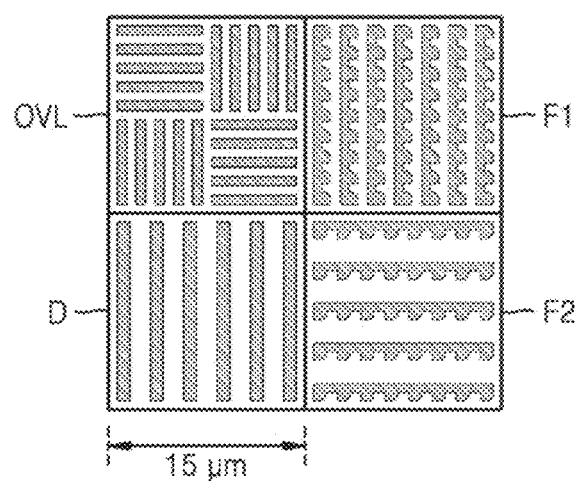
Figure 5C:
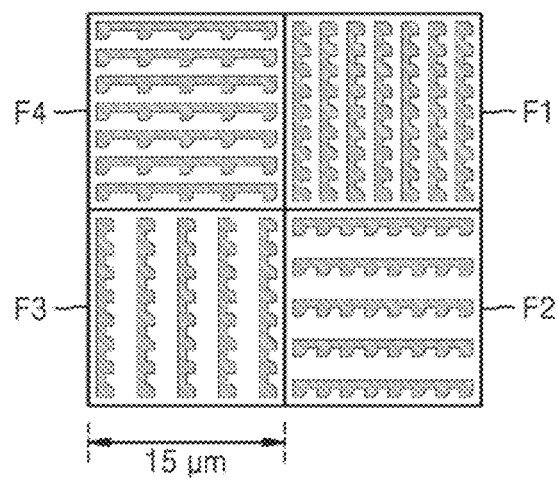
Figure 5D:
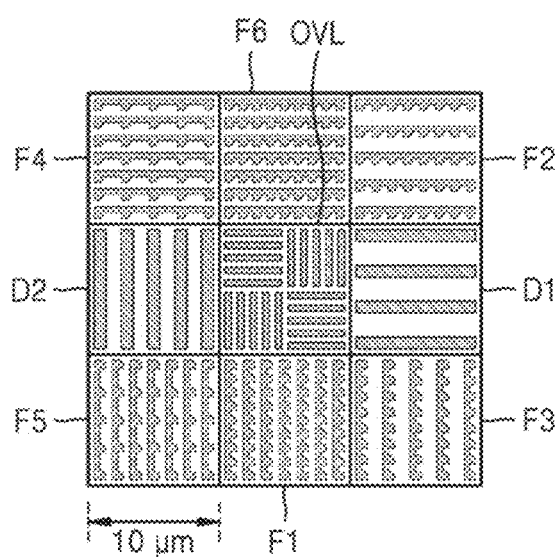

On the other hand, according to the inspection device 100 of the example embodiment, in the vertical optical system Vop having high resolution, because the first detector 190-1 has a pixel size of 500 nm or less and has resolution corresponding thereto, the sizes of the measurement keys may be reduced to 30 μm or less. In FIGS. 5B to 5D, various shapes of measurement keys having reduced sizes are illustrated as examples.

Referring to FIG. 5B, two focus keys F1 and F2, one dose key D, and one overlay key OVL may be formed together in a 2*2 array structure each having a size of 15 μm. Because four measurement keys F1, F2, D, and OVL are formed together in a 2*2 array structure, the size of the four measurement keys in total may be 30 μm. In the inspection device 100 of the example embodiment, based on the vertical optical system Vop having high resolution is used, even when each of the measurement keys F1, F2, D, and OVL is reduced to have a size of 30 μm or less, measurement issues as described above may be improved.

As shown in FIG. 5B, the two focus keys F1 and F2 may have different shapes and directions from each other. Thus, a focus state may be more precisely inspected. In addition, when a plurality of focus keys, for example, the focus keys F1 and F2, and the dose key D are used together, the consistency of measurement may be improved due to the minimization of a correlation between the dose key D and the focus key F1 or F2. The measurement keys F1, F2, D, and OVL may be densified 4 times compared to 30 μm-size measurement keys in the related art. Therefore, the measurement keys F1, F2, D, and OVL may simultaneous improve measurement and measurement throughput.

Referring to FIG. 5C, four focus keys F1 to F4 may be formed together in a 2*2 array structure each having a size of 15 μm. The four focus keys F1 to F4 as a group may have a size of 30 μm in total. The four focus keys F1 to F4 may have different shapes and directions from each other. Thus, a focus state may be more precisely measured. Although the focus key F is taken as an example, embodiments are not limited thereto. For example, four dose keys D may be formed together in a 2*2 array structure each having a size of 15 μm.

Referring to FIG. 5D, six focus keys F1 to F6, two dose keys D1 and D2, and one overlay key OVL may be formed together in a 3*3 array structure each having a size of 10 μm. The nine measurement keys F1 to F6, D1, D2, and OVL as a group may have a size of 30 μm in total. In the inspection device 100 of the example embodiment, because the vertical optical system Vop having high resolution is used, even when each of the measurement keys F1 to F6, D1, D2, and OVL is formed to a size of 30 μm or less, measurement issues may be improved.

In FIG. 5D, as the six focus keys F1 to F6 are used, a focus state may be more precisely measured, and as the two dose keys D1 and D2 are used, a dose state may be more precisely measured. The measurement keys F1 to F6, D1, D2, and OVL may be densified 9 times as high as existing 30 μm-size measurement keys. Therefore, the measurement keys F1 to F6, D1, D2, and OVL may further improve simultaneous measurement and measurement throughput.

An arrangement of the four measurement keys F1, F2, D, and OVL in the 2*2 array structure of FIG. 5B, and an arrangement of the nine measurement keys F1 to F6, D1, D2, and OVL in the 3*3 array structure of FIG. 5D are not limited to those illustrated and may be variously changed. For example, an arrangement of measurement keys, for example, F, D, and OVL may be adjusted according to degrees of measurement importance, thereby maximizing an amount of information and improving the precision of measurement.

Although structures, in which each of the measurement keys F, D, and OVL is formed to have a size of 15 μm or 10 μm, have been described with reference to FIGS. 5B, 5C, and 5D, the size of each of the measurement keys F, D, and OVL is not limited thereto. For example, according to example embodiments, each of the measurement keys F, D, and OVL may be formed to have a size that is less than 10 µm.

Figure 6A:
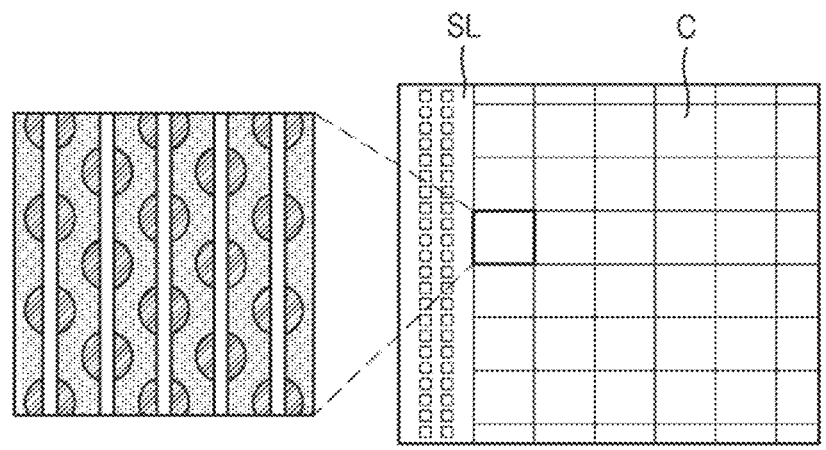
FIGS. 6A and 6B are conceptual diagrams illustrating on-cell overlay measurement using the IE-based inspection device of FIG. 1 and effects according thereto.
Figure 6B:
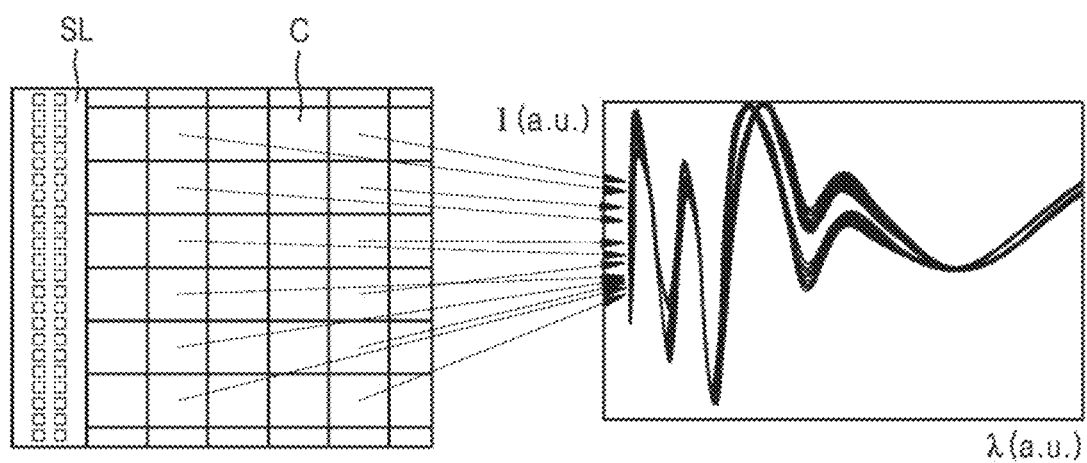

FIGS. 6A and 6B are conceptual diagrams illustrating on-cell overlay measurement using the IE-based inspection device of FIG. 1 and effects according thereto Descriptions will be made with reference to FIGS. 6A and 6D together with FIG. 1, and repeated descriptions given with reference to FIGS. 1 to 4B will be briefly made or omitted.

Referring to FIG. 6A, a concept of measuring an overlay in one cell C is illustrated. More specifically, although overlay measurement in the related art targets the overlay key OVL in the scribe lane SL outside the cell C, overlay measurement between patterns directly in the cell C is required recently. In the case of inspection devices in the related art, only an extremely small number of cells may be measured through sampling due to a spot size of 30 µm or more and an issue of measurement speed. For example, in FIG. 6A, only one of 25 cells C may be selected and measured as an overlay. The enlarged view in FIG. 6A illustrates that an overlay between circular holes at the lower side and lines extending over the holes is measured.

As such, when a few cells C are sampled and measured, it is difficult to obtain the locality of overlay according to process variation. Herein, locality may be a tendency exhibited at each position. For example, according to inspection devices in the related art, an overlay key formed only in a scribe lane is measured or only a specific cell is selected and measured as to an overlay between patterns, and thus a tendency of an overlay for each position according to process variation, that is, the locality of overlay, is not allowed to be secured.

Referring to FIG. 6B, in the inspection device 100 of the example embodiment, a 2D image for each wavelength regarding all cells C, for example, 25 cells C, may be obtained by using the tilted optical system Top of a large-area type. In addition, from the 2D image for each wavelength, the intensity I for each wavelength may be extracted for each cell in relation to an overlay. Graphs in FIG. 6B show intensity I for each wavelength, for 25 cells C. In FIG. 6B, as an example, 12 graphs corresponding to 12 cells C are indicated by arrows.

As such, an overlay is measured on all cells, whereby a tendency of the overlay for each position according to process variation may be measured. For example, in the inspection device 100 of the example embodiment, the overlay may be measured on all the cells by using the tilted optical system Top, thereby obtaining the overlay locality according to process variation. In addition, when the overlay is measured on all of the cells, because noise caused by randomness is canceled out by each other due to an average effect and thus removed, a more accurate overlay information may be obtained.

Further, according to the inspection device 100 of the example embodiment, the intensity I for each wavelength regarding the overlay may be extracted for each cell of the entire wafer at high speed by using the tilted optical system Top of a large-area type. Thus, an overlay map for the entire wafer may be obtained. Here, as described above, reference data regarding a normal state may need to be stored in advance to determine an overlay state, and the overlay state may be determined by comparing the overlay map obtained with the reference data.

When the reference data is not prepared in advance, deep learning may be performed by using, as basic data of deep learning, data about the intensity I for each wavelength, thereby deriving the reference data. In the case of inspection devices in the related art, because there is only data about a particular region such as the scribe lane SL or only data about a few cells through sampling, it is difficult to perform deep learning and it is difficult to obtain an accurate result even when deep learning is performed. In contrast, according to the inspection device 100 of the example embodiment, massive data may be secured for cells of the entire wafer based on the tilted optical system Top of a large-area type, whereby it may be easier to perform deep learning and a result thereof may be more accurate.

Figure 7:
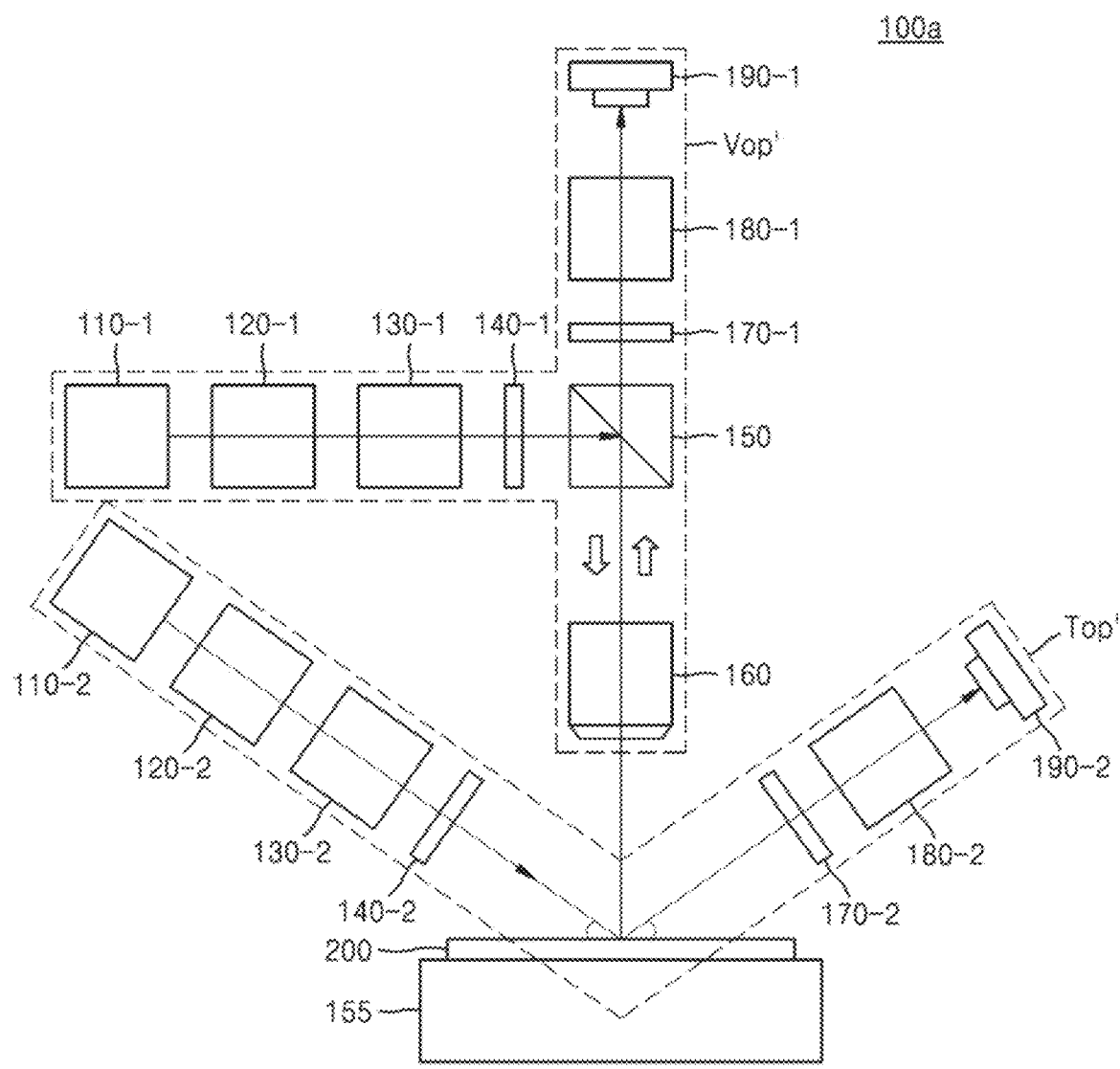
FIG. 7 is a structure diagram schematically illustrating an IE-based inspection device according to an example embodiment.

FIG. 7 is a structure diagram schematically illustrating an IE-based inspection device according to an example embodiment. Repeated descriptions given with reference to FIGS. 1 to 6B will be briefly made or omitted.

Referring to FIG. 7, an inspection device 100a of the example embodiment may be different from the inspection device 100 of FIG. 1, in that a vertical optical system Vop' and a tilted optical system Top' in the inspection device 100a are configured separate from each other. For example, in the inspection device 100a of the example embodiment, the vertical optical system Vop' and the tilted optical system may include respective light sources and respective monochromators. For example, the vertical optical system Vop' may include a first light source 110-1, a first monochromator 120-1, the first collimator 130-1, the first polarizer 140-1, the beam splitter 150, the objective lens 160, the first analyzer 170-1, the first imaging lens unit 180-1, and the first detector 190-1. In addition, the tilted optical system Top' may include a second light source 110-2, a second monochromator 120-2, the second collimator 130-2, the second polarizer 140-2, the second analyzer 170-2, the second imaging lens unit 180-2, and the second detector 190-2.

Both the first light source 110-1 and the second light source 110-2 may be broadband light sources. However, according to example embodiments, the first light source 110-1 may emit light in a wavelength range that is different from the second light source 110-2. The first monochromator 120-1 and the second monochromator 120-2 may perform substantially the same operation. However, when the first light source 110-1 emits light in a wavelength range that is different from the second light source 110-2, wavelengths of monochromatic light output through the first monochromator 120-1 may be different from wavelengths of monochromatic light output through the second monochromator 120-2.

Figure 8A:
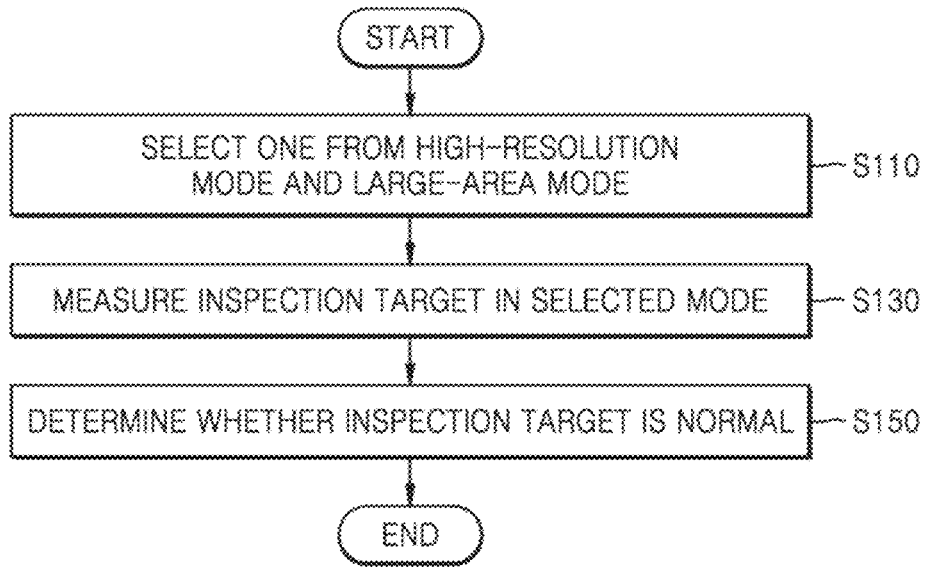
FIGS. 8A to 8C are flowcharts respectively illustrating IE-based inspection methods according to example embodiments.
Figure 8B:
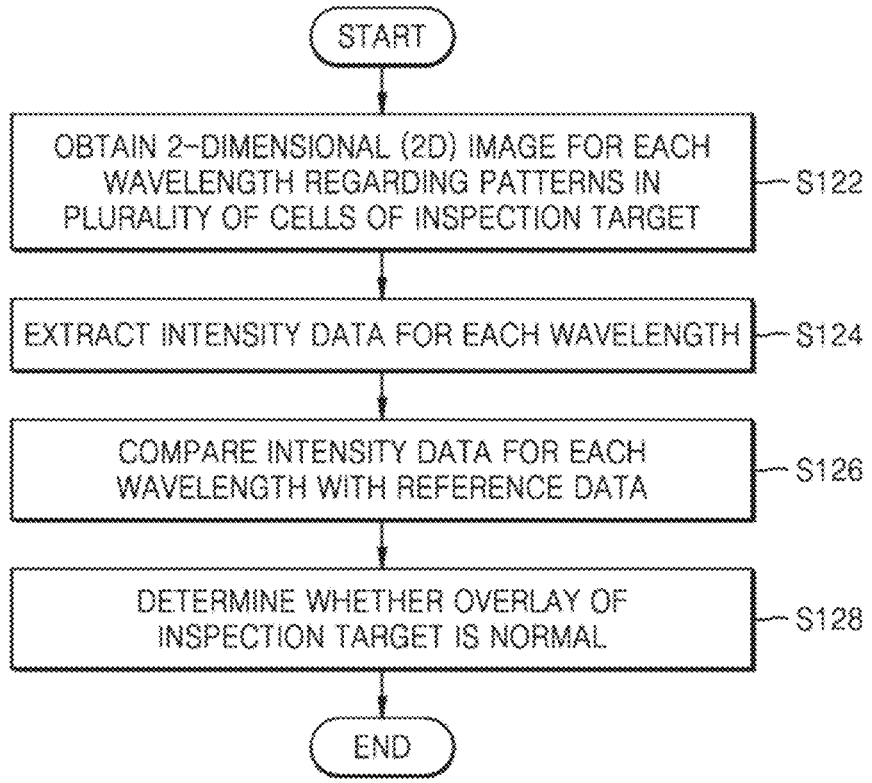
Figure 8C:
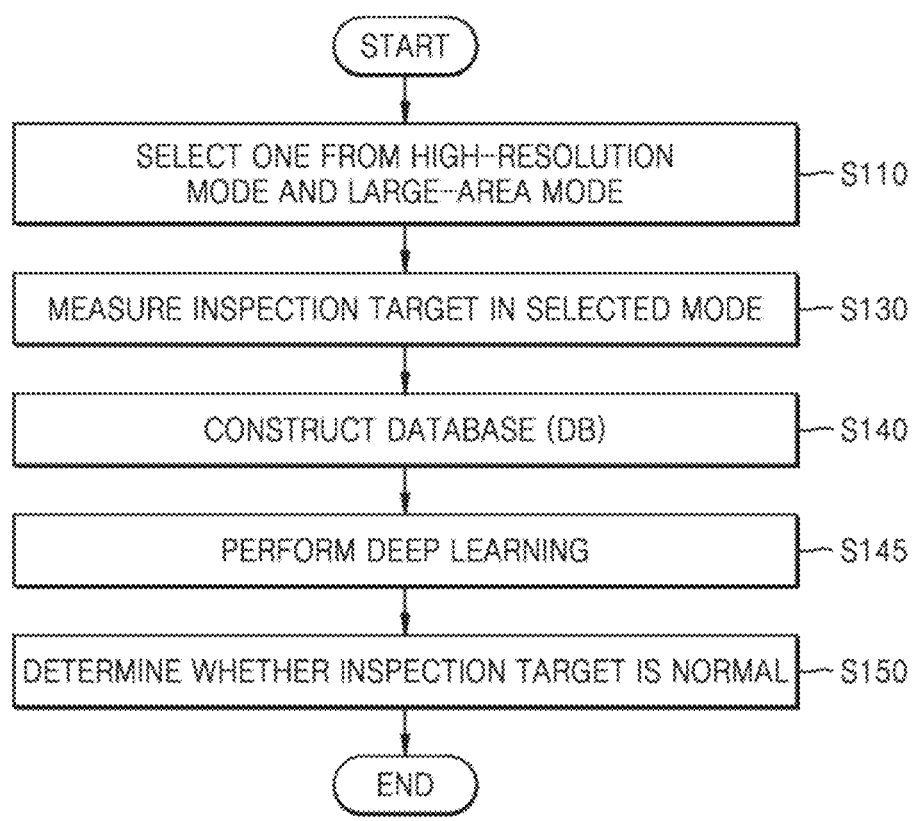

FIGS. 8A to 8C are flowcharts respectively illustrating IE-based inspection methods according to example embodiments. Descriptions will be made with reference to FIGS. 8A to 8C together with FIG. 1, and repeated descriptions given with reference to FIGS. 1 to 7 will be briefly made or omitted.

Referring to FIG. 8A, according to the IE-based inspection method of the example embodiment, first, one of a high-resolution mode and a large-area mode of the inspection device 100 is selected (S110), wherein the high-resolution mode corresponds to the vertical optical system Vop, and the first detector 190-1 of the vertical optical system Vop may have a pixel size of 500 nm or less and an FOV of 400*400 µm$^2$ or more. In addition, the large-area mode corresponds to the tilted optical system Top, and the second detector 190-2 of the tilted optical system Top may have a pixel size of 10 µm or less and an FOV of 9*9 mm$^2$ or less.

After a mode is selected, the inspection target 200 is measured in the selected mode by using the inspection device 100 (S130). The measuring of the inspection target 200 may be obtaining a 2D image for each wavelength by using the inspection device 100.

After the inspection target 200 is measured, whether the inspection target 200 is normal is determined. (S150). The determining of whether the inspection target 200 is normal may be performed, for example, by obtaining, from the 2D image for each wavelength, graphs depicting intensity for each wavelength regarding measurement keys and comparing the obtained graphs with a reference graph. The reference graph may be graphs depicting intensity for each wavelength regarding measurement keys, the intensity for each wavelength being obtained from the inspection target 200 that is normal.

The IE-based inspection method of the example embodiment may perform only the measurement on the inspection target 200. For example, a CD or a shape of pattern of the inspection subject 200 may be measured, and the determination as to whether it is normal may be omitted. In other words, in the IE-based inspection method of the example embodiment, operation S150 of determining whether the inspection target is normal may be omitted. Accordingly, the IE-based inspection method of the example embodiment may include a concept of a measurement method, and the inspection object 200 may correspond to a type of measurement object.

The measuring of the inspection target 200 and the determining of whether the inspection target 200 is normal will be described in more detail with reference to FIG. 8C.

The determining of whether the inspection target 200 is normal may include determining whether a semiconductor process, for example, a lithography process, performed on the inspection target 200 is normal. For example, in the determining of whether the inspection target 200 is normal, when the inspection target 200 is determined to be abnormal, the lithography process performed on the inspection target 200 may also be determined to be abnormal or in error.

In addition, determining whether the inspection target 200 is normal (S150) may include storing, in a storage, feedback data obtained by performing collection, classification, indexing or the like on data extracted from the inspection target 200. The feedback data stored may be used for the generation and calibration of the reference data. In addition, the feedback data and the reference data may be used afterwards as control data in a semiconductor process, for example, a lithograph process.

Referring to FIG. 8B, according to the IE-based inspection method of the example embodiment, a 2D image for each wavelength regarding patterns in a plurality of cells of the inspection target 200 are obtained by using the inspection device 100 (S122). The 2D image for each wavelength may be obtained in one of a high-resolution mode and a large-area mode of the inspection device 100. For example, in the IE-based inspection method of the example embodiment, the 2D image for each wavelength may be obtained in the large-area mode. Thus, the 2D image for each wavelength regarding patterns in a larger region may be obtained at a higher speed.

Next, intensity data for each wavelength is extracted from the 2D image for each wavelength (S124). The intensity data for each wavelength may be extracted for each cell and shown in a graph form, for example, as illustrated in FIG. 6B.

Next, the intensity data for each wavelength is compared with reference data (S126). Here, the reference data may be intensity data for each wavelength, which is obtained by measuring the inspection target 200 that has been determined to be normal. However, when the reference data is not prepared in advance, the reference data may be derived through deep learning by using, as basic data, a plurality of pieces of intensity data for respective wavelengths.

Next, it is determined whether an overlay of the inspection target 200 is normal (S128). For example, when an error between the intensity data for each wavelength and the reference data falls within an acceptable range, an overlay state of the inspection target 200 may be determined to be normal, and when the error is outside of the acceptable range, the overlay state of the inspection target 200 may be determined to be abnormal. The acceptable range may be set based on the performance of a final semiconductor device.

Referring to FIG. 8C, according to the IE-based inspection method of the example embodiment, the operation of selecting a mode (S110) and the operation of measuring an inspection target (S130) in FIG. 8A may be sequentially performed in this order.

Next, by using data obtained in operation of measuring the inspection target (S130), a DB is constructed (S140). Here, the constructing of the DB may be performed by performing collection, classification, indexing, or the like on the data extracted from the inspection target 200 and storing the resulting data in a storage. A large amount of data extracted from a plurality of inspection targets 200 may be stored in the DB.

After the DB is constructed, deep learning is performed by using pieces of data in the DB (S145). There may be various kinds of deep learning depending upon characteristics of data. For example, the deep learning may use a learning algorithm such as convolutional neural networks (CNNs), deep neural networks (DNNs), recurrent neural networks (RNNs), or the like. Reference data for the extracted data may be derived through the deep learning.

After the deep learning is performed, it is determined whether the inspection target 200 is normal (S150). In the determining of whether the inspection target 200 is normal, the reference data obtained in the deep learning set forth above may be used. For example, a graph depicting intensity for each wavelength regarding measurement keys may be obtained from a 2D image for each wavelength, and it may be determined whether the inspection target 200 is normal, by comparing the obtained graph with the reference graph obtained in the deep learning.

The pieces of data used to construct the DB and the reference data obtained by the deep learning, may be used afterwards as control data in a semiconductor process, for example, a lithograph process.

Figure 9A:
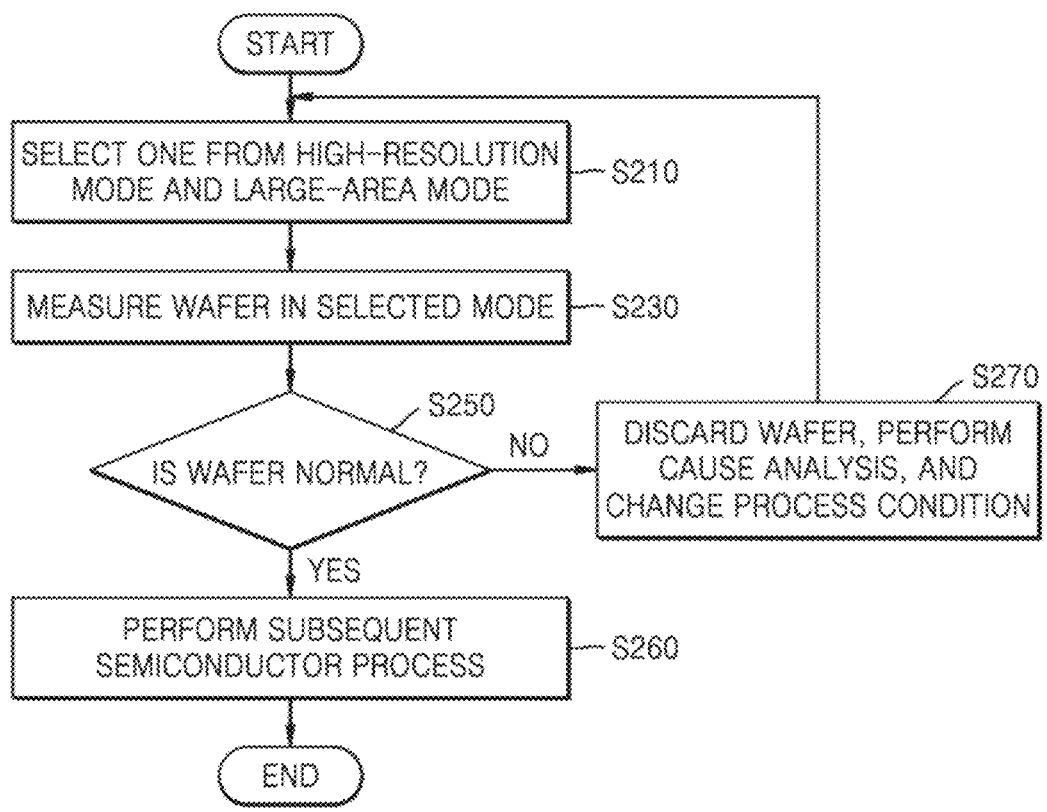
FIGS. 9A and 9B are flowcharts respectively illustrating methods of fabricating a semiconductor device by using an IE-based inspection method according to example embodiments.
Figure 9B:
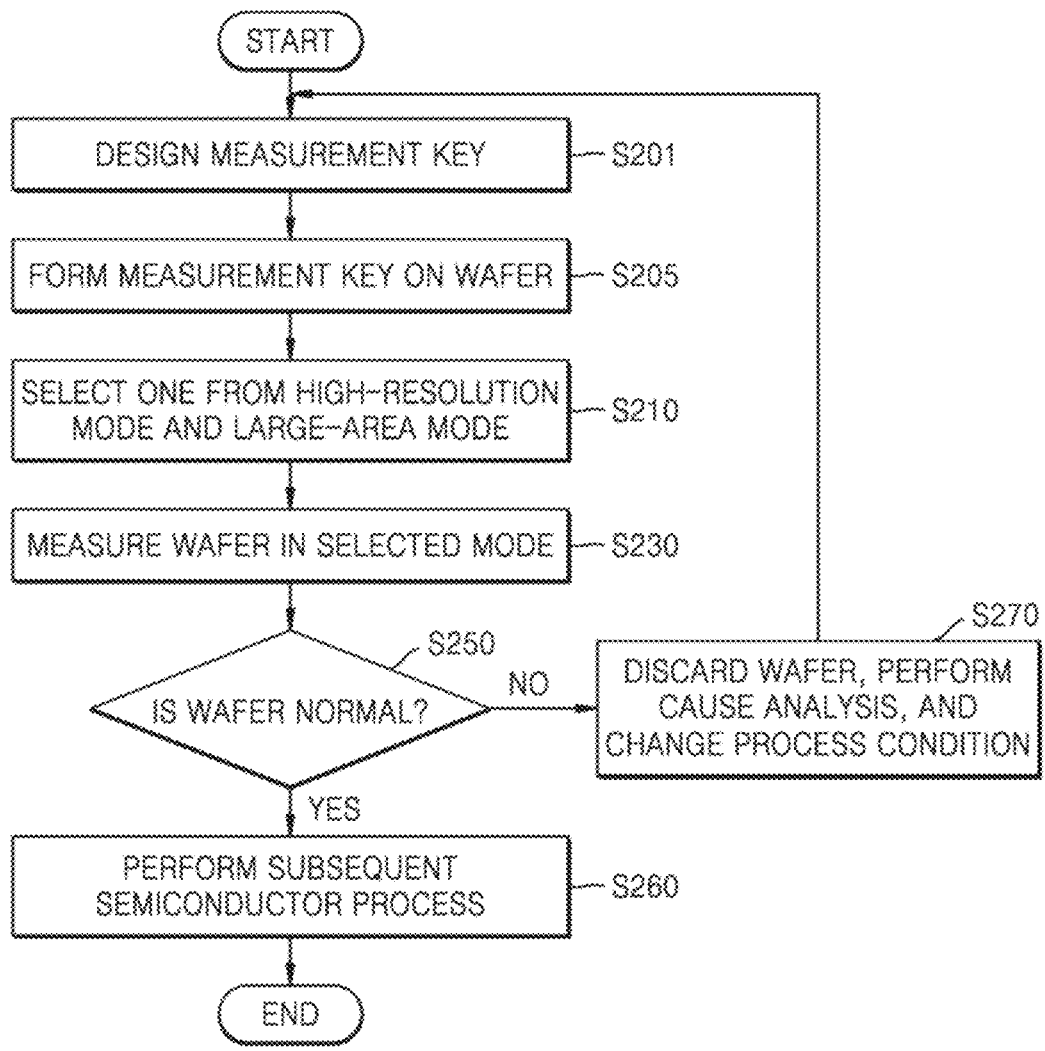

FIGS. 9A and 9B are flowcharts respectively illustrating methods of fabricating a semiconductor device by using an IE-based inspection method according to example embodiments. Descriptions will be made with reference to FIGS. 9A and 9B together with FIG. 1, and repeated descriptions given with reference to FIGS. 8A to 8C will be briefly made or omitted.

Referring to FIG. 9A, according to the method of fabricating a semiconductor device according to the example embodiment, first, operation of selecting a mode (S210), operation of measuring a wafer (S230), and operation of determining whether the wafer is normal (S250) are sequentially performed in this order. Operation S210 of selecting the mode, operation S230 of measuring the wafer, and operation S250 of determining whether the wafer is normal are the same as those described regarding the IE-based inspection method of FIG. 8A. However, although the inspection target 200 is not specified in the case of FIG. 8A, the inspection target 200 in the method of fabricating a semiconductor device according to the example embodiment may be specified as a wafer.

Next, when the wafer is determined to be normal (Yes) in operation of determining whether the wafer is normal (S250), a subsequent semiconductor process is performed on the wafer (S260). Through the subsequent semiconductor process for the wafer, a plurality of semiconductor devices may be fabricated from the wafer. The subsequent semiconductor process for the wafer may include various processes. For example, the subsequent semiconductor process for the wafer may include a deposition process, an etching process, an ion process, a cleaning process, or the like. In addition, the subsequent semiconductor process for the wafer may include a test process of a semiconductor device at a wafer level. Further, the subsequent semiconductor process for the wafer may include a process of individualizing the wafer into semiconductor chips and a process of packaging the semiconductor chips. Here, the packaging process may refer to a process of mounting the semiconductor chips on a printed circuit board (PCB) and encapsulating the resulting semiconductor chips with a sealant and may include forming a stack package by stacking a plurality of semiconductors in multiple layers on the PCB or forming a package-on-package (POP) structure by stacking a stack package on a stack package. A semiconductor device or a semiconductor package may be completed through the packaging process of a semiconductor chip.

When the wafer is determined to be abnormal (No) in the operation of determining whether the wafer is normal (S250), for example, when the wafer is defective, the wafer is discarded and cause analysis is performed, thereby changing a process condition (S270). Here, the process condition may be, for example, a process condition of a lithography process. As an example, when the cause of defect is a poor focus, a focus position is adjusted, and when the cause of defect is a poor dose, the dose may be adjusted. Next, the method may proceed back to operation of selecting the mode (S210). However, the wafer to be inspected in a subsequent operation may be a wafer on which a lithography process has been performed under the process condition changed in operation of changing the process condition (S270).

Referring to FIG. 9B, according to the method of fabricating a semiconductor device according to the example embodiment, first, a measurement key is designed (S201). For example, the measurement key may include a focus key, an overlay key, or a dose key. In addition, the measurement key may be designed to have a size of 30 μm or to a size of 15 μm or less.

When the measurement key is designed to have a size of 15 μm or less, the measurement key may be designed in a 2*2 or 3*3 array structure, as shown in FIGS. 5B, C, and 5D. In addition, in the 2*2 or 3*3 array structure, all measurement keys may be the same, or at least one of the measurement keys may be different.

After the measurement key is designed, the measurement key is formed on a wafer (S205). For example, a mask for the designed measurement key may be formed, followed by transferring the measurement key onto the wafer by a lithograph process, thereby forming the measurement key on the wafer.

After the measurement key is formed on the wafer, operation of selecting a mode (S210), operation of measuring the wafer S230), and operation of determining whether the wafer is normal (S250) are sequentially performed in this order. Operation of selecting the mode (S210), operation of measuring the wafer (S230), and operation of determining whether the wafer is normal (S250) are the same as those described regarding the IE-based inspection method of FIG. 8A. However, in the aforementioned operation of designing the measurement key, when the measurement key is formed in a 2*2 or 3*3 array structure while having a size of 15 μm or less, a high-resolution mode may be selected in operation of selecting the mode (S210).

Next, as in FIG. 9A, depending upon whether the wafer is normal, operation of performing a subsequent semiconductor process (S260) or operation of changing a process condition (S270) may be performed. After operation of changing the process condition (S270), the method may proceed to operation of forming the measurement key on the wafer (S205). The lithography process having a changed process condition may be applied to operation of forming the measurement key on the wafer (S205). In addition, the forming of the measurement key on the wafer may include forming another pattern, in addition to the measurement key, on the wafer by the changed lithography process.

While example embodiments been particularly shown and described, it will be understood that various changes in form and details may be made therein without departing from the spirit and scope of the following claims.

What is claimed is:

1. An imaging ellipsometry (IE)-based inspection method comprising:
selecting a mode from among a first mode of an IE-based inspection device having a first field of view (FOV) and a second mode of the IE-based inspection device having a second FOV; and
measuring an inspection target by the IE-based inspection device in the selected mode,
wherein the measuring of the inspection target comprises simultaneously measuring patterns included in a plurality of cells provided in a region of the inspection target, the region corresponding to an FOV of the selected mode,
wherein the inspection target is measured in a large-area mode corresponding to the second mode that is operated by a tilted optical system comprising a second detector that is inclined with respect to a stage on which the inspection target is provided,
wherein the inspection target is a semiconductor chip,
wherein the second detector is configured to obtain a two-dimensional image of an entire region of the semiconductor chip based on performing imaging one time in the second mode, and
wherein an overlay for each region of the semiconductor chip is determined by averaging overlay values measured on the entire region of the semiconductor chip.

2. The IE-based inspection method of claim 1, wherein the inspection target is a wafer comprising a plurality of semiconductor chips including the semiconductor chip, and
wherein an overlay for each region of the wafer is determined by averaging overlay values measured on an entire region of the wafer.

3. The IE-based inspection method of claim 1, wherein the measuring of the inspection target comprises obtaining the 2D image for each wavelength of the patterns included in the plurality of cells, and extracting measured data of each wavelength based on the 2D image corresponding to each wavelength.

4. The IE-based inspection method of claim 3, further comprising:
determining whether the inspection target is normal based on a result of the measuring,
wherein the determining of whether the inspection target is normal comprises determining an overlay of the inspection target by comparing the measured data of each wavelength with reference data.

5. The IE-based inspection method of claim 4, wherein the reference data is obtained from the inspection target, which has been determined to be in a normal state, or is obtained based on deep learning by using, as basic data, a plurality of pieces of measured data for respective wavelengths.

6. The IE-based inspection method of claim 1, wherein at least two types of measurement keys are provided on the inspection target, and
wherein the measuring of the inspection target further comprises simultaneously measuring the at least two types of measurement keys.

7. An imaging ellipsometry (IE)-based inspection method comprising:
selecting a mode from among a first mode of an imaging ellipsometry (IE)-based inspection device having a first field of view (FOV) and a second mode of the IE-based inspection device having a second FOV;
measuring an inspection target by the IE-based inspection device in the selected mode, the inspection target being a semiconductor chip;
obtaining a two-dimensional (2D) image for each wavelength of patterns included in a plurality of cells of the inspection target by an IE-based inspection device; and
extracting intensity data of each wavelength from the 2D image of each wavelength,
wherein the obtaining of the 2D image for each wavelength comprises simultaneously measuring the patterns included in the plurality of cells,
wherein the inspection target is measured in a large-area mode corresponding to the second mode that is operated by a tilted optical system comprising a second detector that is inclined with respect to a stage on which the inspection target is provided,
wherein, in the second mode, a two-dimensional image of an entire region of the semiconductor chip is obtained based on performing imaging one time, and
wherein an overlay for each region of the semiconductor chip is determined by averaging overlay values measured on the entire region of the semiconductor chip.

8. The IE-based inspection method of claim 7, wherein the inspection target is a wafer comprising a plurality of semiconductor chips including the semiconductor chip, and
wherein an overlay for each region of the wafer is determined by averaging overlay values measured on an entire region of the wafer.

9. The IE-based inspection method of claim 7, further comprising:
comparing the intensity data of each wavelength with reference data; and
determining whether an overlay of the inspection target is normal based on a result of the comparing,
wherein the reference data is obtained from the inspection target, which has been determined to be in a normal state, or is obtained through deep learning based on using, as basic data, a plurality of pieces of intensity data for respective wavelengths.

10. A method of fabricating a semiconductor device, the method comprising:
selecting a mode from among a first mode of an imaging ellipsometry (IE)-based inspection device having a first field of view (FOV) and a second mode of the IE-based inspection device having a second FOV;
measuring a wafer by the IE-based inspection device in the selected mode;
determining whether the wafer is normal based on a result of the measuring; and
based on determining that the wafer is normal, performing a semiconductor process on the wafer,
wherein the measuring of the wafer comprises simultaneously measuring patterns included in a plurality of cells provided in a region of the wafer, the region corresponding to an FOV of the selected mode,
wherein the wafer is measured in a large-area mode corresponding to the second mode that is operated by a tilted optical system comprising a second detector that is inclined with respect to a stage on which the wafer is provided,
wherein, in the second mode, a two-dimensional image of an entire region of a semiconductor chip included in the wafer is obtained based on performing imaging one time,
wherein an overlay for each region of the semiconductor chip is determined by averaging overlay values measured on the entire region of the semiconductor chip.

11. The method of claim 10, wherein an overlay for each region of the wafer is determined by averaging overlay values measured on an entire region of the wafer.

12. The method of claim 10, wherein the measuring of the wafer comprises:
obtaining a two-dimensional (2D) image for each wavelength of the patterns included in the plurality of cells, and
extracting intensity data of each wavelength from the 2D image of each wavelength.

13. The method of claim 12, wherein the determining of whether the wafer is normal comprises comparing the intensity data of each wavelength with reference data.

14. The method of claim 13, wherein the reference data is obtained from the wafer, which has been determined to be in a normal state, or is obtained based on deep learning by using, as basic data, a plurality of pieces of intensity data for respective wavelengths.

15. The method of claim 10, further comprising:
designing at least two types of measurement keys prior to selecting one from the first mode and the second mode; and
providing the at least two types of measurement keys on the wafer,
wherein the measuring of the wafer further comprises simultaneously measuring the at least two types of measurement keys.

16. The method of claim 15, wherein the designing of the at least two types of measurement keys comprises designing each of the at least two types of measurement keys to have a size that is greater than or equal to 30 μm or that is less than or equal to 15 μm.

17. The method of claim 16, wherein each of the at least two types of measurement keys being designed to have a size of 15 μm or less, and the at least two types of measurement keys are provided adjacent to each other in a 2*2 or 3*3 array structure, and
wherein the at least two types of measurement keys are measured in a high-resolution mode corresponding to the first mode or are measured by a vertical optical system.

* * * * *